United States Patent [19]

Nagayama

[11] Patent Number: 4,614,907
[45] Date of Patent: Sep. 30, 1986

[54] METHOD OF OBTAINING PSEUDOFILTERING EFFECT IN PROCESS OF DATA ACCUMULATION AND NUCLEAR MAGNETIC RESONANCE SPECTROMETRY UTILIZING SAME

[75] Inventor: Kuniaki Nagayama, Tokyo, Japan
[73] Assignee: Jeol Ltd., Tokyo, Japan
[21] Appl. No.: 668,647
[22] Filed: Nov. 6, 1984

[30] Foreign Application Priority Data
Nov. 11, 1983 [JP] Japan ................... 58-212188

[51] Int. Cl.$^4$ .......................... G01N 24/00
[52] U.S. Cl. .................. 324/312; 324/314; 328/151; 364/572
[58] Field of Search ........... 324/307, 312, 77 H, 324/77 G, 314; 364/572; 333/165; 328/130.1, 151, 167; 307/352

[56] References Cited

U.S. PATENT DOCUMENTS

| | | | |
|---|---|---|---|
| 3,521,170 | 7/1970 | Leuthold et al. | 333/165 |
| 3,809,923 | 5/1974 | Esser | 333/165 |
| 3,824,452 | 7/1974 | Freeman et al. | 324/314 |
| 3,873,909 | 3/1975 | Ernst | 324/312 |
| 3,968,423 | 7/1976 | Hoshino et al. | 324/312 |

OTHER PUBLICATIONS

"Two-Dimensional Chemical Exchange and Cross-Relaxation Spectrometry of Coupled Nuclear Spins" by S. Macura et al., *Journal of Magnetic Resonance*, 43 259–281 (1981).

Primary Examiner—Stewart J. Levy
Assistant Examiner—Kevin D. O'Shea
Attorney, Agent, or Firm—Webb, Burden, Robinson & Webb

[57] ABSTRACT

In a Fourier transform nuclear magnetic resonance spectrometer, a signal which is produced repeatedly from a time origin is sampled at regular intervals of time to convert the signal into digital form, the time origin being given repeatedly. Then, the digitized data is accumulated. According to the present invention, delay periods beginning with each time origin and ending with the beginning of each sampling are made different from one another to obtain a pseudofiltering effect simply by using a relatively simple structure of apparatus and performing arithmetic operations on data.

5 Claims, 20 Drawing Figures

METHOD OF OBTAINING PSEUDOFILTERING EFFECT IN PROCESS OF DATA ACCUMULATION AND NUCLEAR MAGNETIC RESONANCE SPECTROMETRY UTILIZING SAME

BACKGROUND OF THE INVENTION

The present invention relates to a method of obtaining a pseudofiltering effect in the process of data accumulation.

Various filters are used in signal or information processing applications. Conventional filters are classified into two major categories: real-time filter and digital filter. The real-time filter takes the form of an electronic part or circuit that uses a resistor, a capacitor, etc. The digital filter digitizes its incoming signal and stores it, and then performs an arithmetic operation on the stored data to remove unwanted frequency components.

Real-time filters are extensively used in various apparatus as an important component. However, their characteristics offer only a limited degree of freedom, and it is not easy to modify the characteristics. Further, it is difficult to independently set the two filter characteristics, i.e., amplitude and phase. In contrast, digital filter have some advantages that real-time filters cannot offer. For example, digital filters have a function which can be set at will, and permit various filter functions to be worked upon the same data in turn by trial and error. However, it is necessary for digital filters to accept a large volume of raw data and place it in memory once. In addition, programs must be prepared for complicated arithmetic operations. In this way, use of a digital filter needs complex and large hardware. The prior art relating to filtering as applied in the field of nuclear magnetic resonance spectrometry is described in U.S. Pat. No. 3,824,452 and *Journal of Magnetic Resonance*, 43, 256–281, (1981).

SUMMARY OF THE INVENTION

It is the main object of the present invention to provide a filter that is free of the difficulties with the aforementioned two kinds of filters.

The data accumulation operation according to this invention comprises the steps of: sampling a signal at regular intervals of time; the signal being produced repeatedly from a time origin that is given repeatedly; converting the sampled data into digital form; and accumulating the resulting data. This operation is characterized in that the delay periods elapsing between each time origin and the beginning of each sampling are made different. The invention is hereinafter described in detail with reference to the accompanying drawings.

DESCRIPTION OF THE PREFERRED EMBODIMENTS

Figure 1:
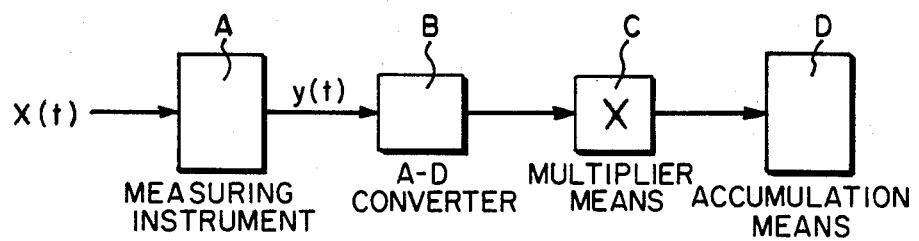
FIG. 1 is a schematic diagram of a fundamental structure embodying the method according to the present invention.

Referring first to FIG. 1, there is shown a fundamental structure for carrying out the method according to the invention. An external trigger signal x(t) is shown to be applied to a measuring instrument A and gives a time origin repeatedly. The measurement is repeated such that each measurement starts at the time origin. The output signal y(t) which is repeatedly derived from the instrument A in this way is sampled by an analog-to-digital converter B at regular intervals of time and converted into digital form. The digitized data is then supplied via a multipler means C to a data accumulation means D for accumulation.

Figure 2A:
FIGS. 2(a), 2(b), 2(c), and 2(d) are timing diagrams illustrating the operation of the structure shown in FIG. 1.
Figure 2B:
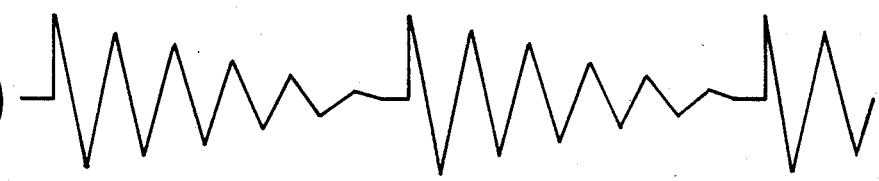
Figure 2C:
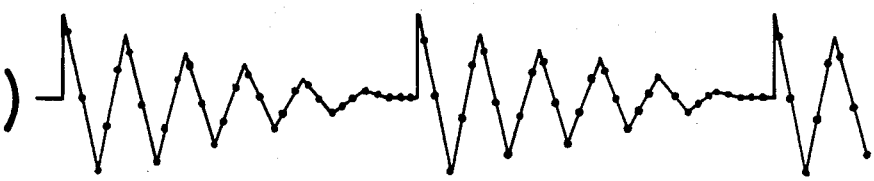

The trigger signal x(t) is shown in FIG. 2(a). The output signal y(t) that is repeatedly generated from the instant of the application of the trigger signal is shown in FIG. 2(b). Heretofore, the output signal y(t) has been always sampled at equally spaced points, as shown in FIG. 2(c), before analog-to-digital conversion and accumulation.

Figure 2D:
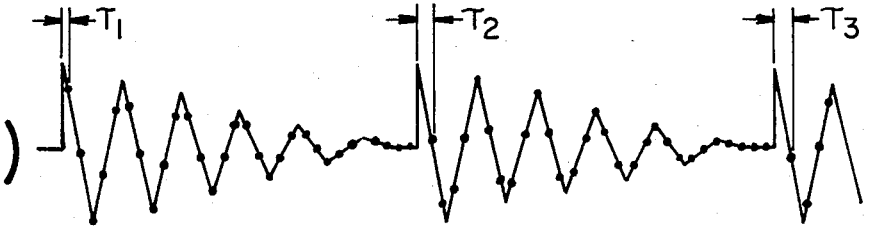

As shown in FIG. 2(d), the present invention is accomplished by making different the delay periods $\tau$ that begin with each time origin and end with the beginning of each sampling. The average of data y(t) which is stored in the accumulation means after N measurements are made is given by $$\overline{y(t)} = \sum_{i=1}^{N} g(\tau i) y(t + \tau i) \qquad (1)$$

where $\tau$ is the delay period in the i-th measurement, and g ($\tau i$) is the weight function of the multiplier means at that time. The period $\tau i$ is longer than the unit delay period $\Delta$ by a factor of an integral number.

The filter function that is obtained by this operation and expresses the filtering effect is obtained by taking the Fourier transform of equation (1) into the domain of frequency $\omega$. That is, $$\overline{Y(\omega)} = \left\{ \left[ \sum_{n=-\infty}^{\infty} G(\omega + n/\Delta) \right] * \text{sinc}(1/m\Delta) \right\} Y(\omega) \qquad (2)$$

where $1/\Delta$ is the reciprocal of the unit delay period, $1/m\Delta$ is the reciprocal of the maximum delay period, and * is a convolution. Included in the brackets ({ }) is the filter function. The function sinc ($1/m\ \Delta$) is defined as sinc $(\pi/m\Delta)/(\pi/m\Delta)$. $G(\omega)$ and $Y(\omega)$ are Fourier pairs of $g(\tau)$ and $y(t)$ in equation (2) respectively.

If the signal y(t) does not include frequency components higher than $1/\Delta$, and if the maximum delay period is not shorter than the interval between the successive sampling points, then the filter function can be approximated by the Fourier transform $G(\omega)$ of the weight function $g(\tau)$.

Figure 3B:
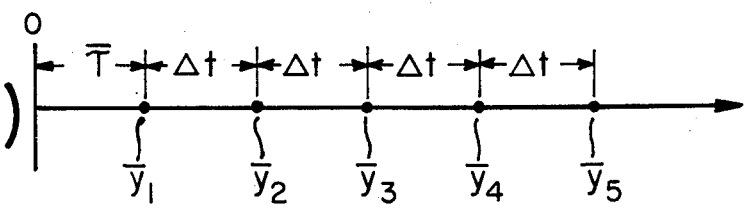
FIG. 3(b) is a representation of data successively stored in an accumulation means.
Figure 3A:
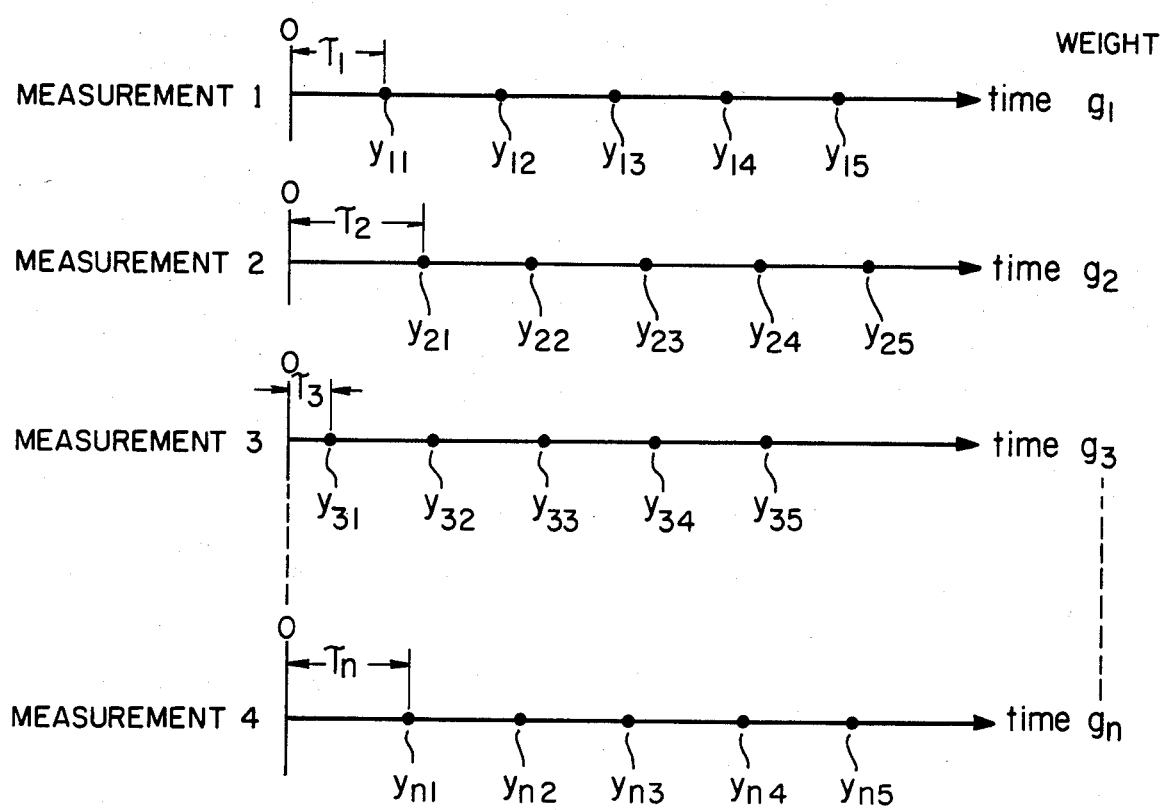
FIG. 3(a) specifically shows the manner in which the output signal from a measuring instrument A is sampled in accordance with the invention when the output signal takes one-dimensionsal form.

FIG. 3(a) specifically shows the manner in which the output signal from the measuring instrument A is sampled in accordance with the invention when the output signal is a one-dimensional signal. The measurement is initiated at the instant of time origin O and repeated N times. In measurement 1 which is initiated when delay period $\tau1$ has elapsed from the time origin, the output signal is sampled at y11, y12, y13, and so on which are equally spaced apart a time interval $\Delta t$. The sampled values are multiplied by weight g1 by means of the multiplier means before they are fed to the accumulation means. In measurement 2 sampling is initiated after the lapse of delay period $\tau2$. The sampled values y21, y22, y23, and so on are multiplied by weight g2, and then they are furnished to the accumulation means, where they are added to the data previously obtained by measurement 1. Thereafter, similar measurements are made with varying delay periods $\tau3, \tau4, \ldots, \tau i, \ldots, \tau n$. Thus, N measurements are made, and all the resulting data is accumulated after being processed as mentioned above. After the completion of the measurements, the data items $\overline{y1}, \overline{y2}, \ldots, \overline{yi}, \ldots, \overline{yn}$ which are stored in the accumulation means are given by $$\overline{yi} = \sum_{j=1}^{N} gi \cdot yij \quad (3)$$

where yij is expressed by $$yij = y(\tau i + (j-1)\Delta t) \quad (4)$$

Figure 4A:
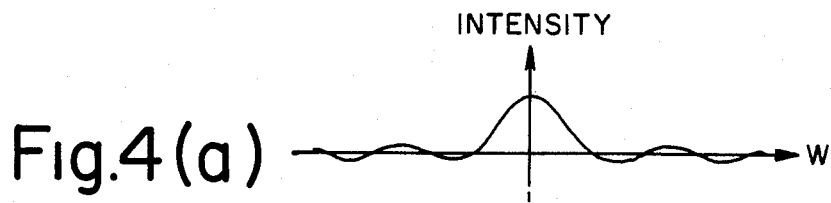
FIGS. 4(a) and 4(b) are diagrams of examples of filter function obtained according to the invention.
Figure 4B:
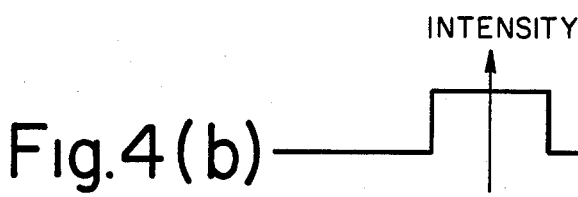

As described previously, the function of the filter embodying the invention is given in the brackets ({ }) of equation (2). Therefore, it is possible to set the filter function arbitrarily selecting $g(\tau)$. As a first typical example, a filter expressed by a sinc function as shown in FIG. 4(a) is obtained by maintaining $g(\tau)$ at a constant value. As a second typical example, a filter given by a boxcar function as shown in FIG. 4(b) is attained by making $g(\tau)$ a sinc function. Obviously, still other filter functions can be set by appropriately setting $g(\tau)$. It should be noted that the filter of the sinc function shown in FIG. 4(a) has been impossible to realize with conventional filters using resistors and capacitors.

The aforementioned filtering effect applied only to coherent signals, i.e., signals having the same time-course profile in several measurements and does not apply to noises that appear at random in different measurements. Hence, the accumulation only enhances the signal-to-noise ratio as long as noises are concerned.

When the aforementioned measuring instrument is a nuclear magnetic resonance spectrometer, i.e., when the invention is applied to nuclear magnetic resonance spectrometry, the time origin mentioned above is the instant at which an exciting RF pulse or pulse train is applied to a sample. The delay periods which elapse between the application of the pulse or pulse train and the beginning of each sampling of the resulting nuclear magnetic resonance signal are rendered different from one another. Then, the obtained values are accumulated.

The embodiment described thus far has given an example of one-dimensional signal for facilitating the understanding, but the invention can equally be applied to the case where a multi-dimensional signal having two or more time parameters is used.

For example, in the case of a signal S (t1, t2) having two time parameters t1 and t2, two delay periods $\tau1$ and $\tau2$ are set corresponding to their respective parameters. The signal $\overline{S}$ (t1, t2) obtained by accumulation is given by $$\overline{S}(t1, t2) = \Sigma g(\tau1, \tau2) \times S(t1+\tau1, t2+\tau2) \tau1, \tau2 \quad (5)$$

Figure 5A:
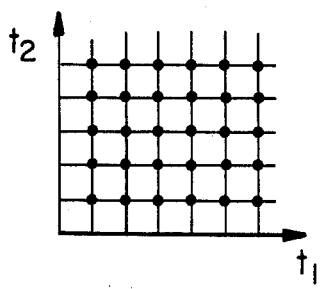
FIGS. 5(a) and 5(b) are diagrams for illustrating the manner in which a two-dimensional signal is processed in accordance with the invention.

The data about $\overline{S}$ (t1, t2) given above is shown in FIG. 5(a), where each dot indicates each piece of data obtained at various values of t1 and t2.

Figure 5B:
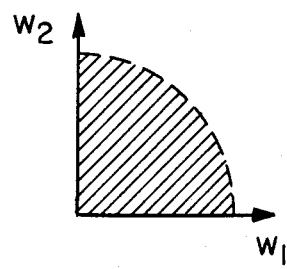

FIG. 5(b) shows the data that has been obtained by taking the double Fourier transform of the data shown in FIG. 5(a) into the domain of frequencies $\omega1$ and $\omega2$ with respect to t1 and t2. It will be understood that the data other than the data lying in the region indicated by the hatching has been removed by the action of the pseudofilter. The two-dimensional cut-off frequency of the filter function is indicated by the broken line in FIG. 5(b).

It is to be noted that the same concept applies to signals having greater numbers of time parameters. For instance, for a signal having k parameters, the signal $\overline{S}$ (t1, t2, . . . , tk) resulting from accumulation is given by $$\overline{S}(t1, t2, \ldots, tk) = \sum_{\tau1, \tau2, \ldots, \tau k} g(\tau1, \tau2, \ldots, \tau k) \times S(t1 + \tau1, t2 + \tau2, \ldots, tk + \tau k) \quad (6)$$

The present invention is favorably employed to obtain two-dimensional nuclear magnetic resonance spectra from samples including nuclear magnetic resonators. In recent years, two-dimensional NMR spectrometry has been widely utilized as a new method relying on NMR. According to this two-dimensional NMR spectrometry, an NMR signal is displayed as a two-dimensional spectrum. This improves the resolution and facilitates the analysis of spectrum as compared with the conventional method. Further, spin-spin couplings can be reduced to the form that can be understood. For these and other reasons, two-dimensional NMR is considered to develop further.

Figure 6:
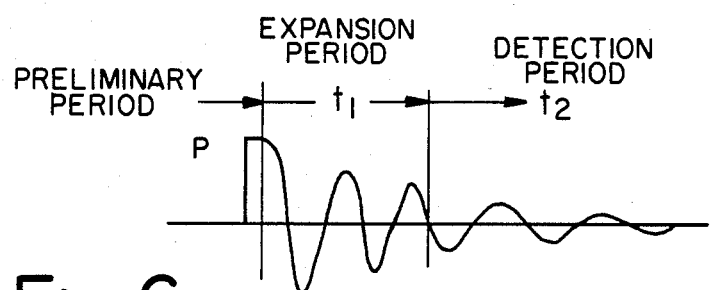
FIG. 6 is a diagram for illustrating a general measuring process in two-dimensional NMR spectrometry.
Figure 7:
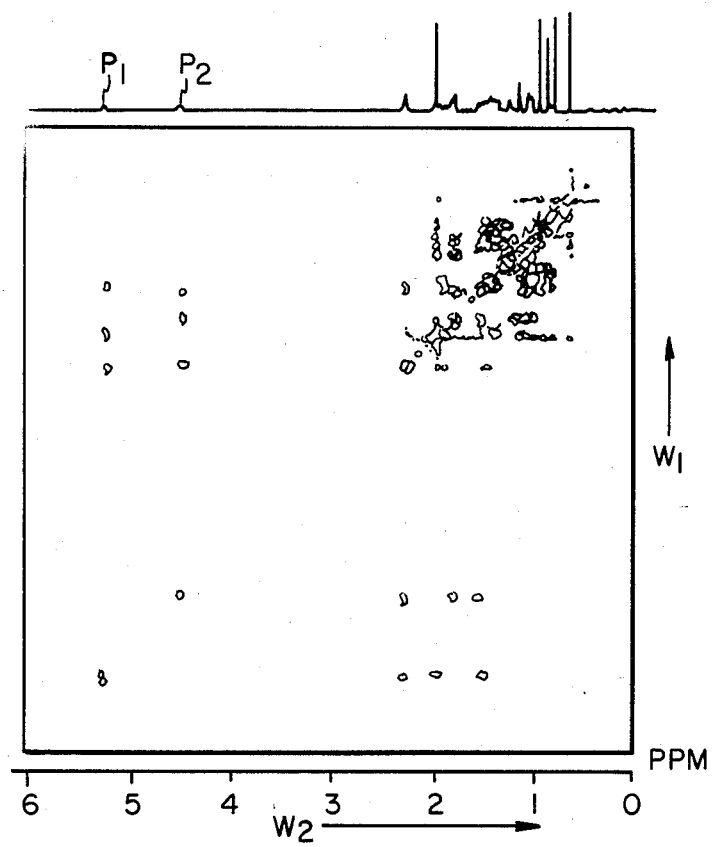
FIG. 7 is a diagram of one example of two-dimensional NMR spectrum.

Referring to FIG. 6, a general measuring process using two-dimensional NMR consists of three periods of time: preliminary period, expansion period (t1), and detection period (t2). The preliminary period is needed to maintain the magnetization in an appropriate initial condition, whereupon an RF pulse P is applied to disequilibrate the magnetization. This condition is expanded in the expansion period t1. The behavior of the magnetization in the period t1 is reflected in phase and amplitude information conveyed in the free induction decay signal which is detected in the detection period t2. Therefore, the detected free induction decay signal contains the information about the magnetization in the period t1 as well as the information about the magnetization in the period t2. Thus, the period t1 is changed in stepwise manner so that it may comprise n different sub-periods, for example, during the measurement. The resultant n free induction decay signals FID1 - FIDn constitute a signal representative of function S (t1, t2), which is then subjected to double Fourier transformation with respect to t1 and t2 to obtain a two-dimensional NMR spectrum as shown in FIG. 7 that is a correlation spectrum of the hydrogen nuclei of cholesterol acetate. In this figure, frequency $\omega 1$ corresponding to t1 is indicated versus frequency $\omega 2$ corresponding to t2.

The aforementioned two-dimensional NMR spectrometry handles a large amount of data, thus necessitating a large capacitory memory. If a filter in some form or other is capable of filtering out regions that are not necessary for analysis, e.g., a region containing two peaks P1 and P2 on the lower magnetic field side in FIG. 7, then the quantity of data will be reduced greatly, saving the storage capacity of the memory. The removal of the two peaks will also prevent the peaks from becoming folded back, which would otherwise be caused by Fourier transformation. This makes the analysis of spectra easier. It is possible to filter out an unwanted range of frequencies by inserting a filter circuit, a real-time circuit, in the detecting circuit, as long as the direction of $\omega 2$ corresponding to real time t2 is concerned. However, since the detected signal relates only to t2, it is impossible to use such a real-time filter that acts in the direction of $\omega 1$ corresponding to t1.

In contrast, a digital filter, which places data in a memory once and then arithmetically processes it, is able to remove any signal in a desired frequency range, thus erasing the peaks. However, according to this method, a large quantity of data must be held in a memory once, making the curtailment in the storage capacity impossible.

This difficulty is completely eliminated by the present invention. In particular, a pseudofiltering effect acts in the direction of $\omega 1$ to remove undesired ranges of frequencies before data is placed in a memory. This permits a nuclear magnetic resonance spectrometry requiring a reduced storage capacity of memory. More specifically, this spectrometry comprises the following steps. (a) An RF pulse is applied to a sample to disequilibrate the system of the nuclear magnetic resonators included in the sample beforehand. (b) During an expansion period of time t1, the disequilibrated condition is caused to proceed. (c) After the expansion period t1, the free induction decay signal derived from the resonators is detected and recorded for a time t2. (d) The steps (a)–(c) are repeated for n different expansion periods t11-t1n to obtain the functions S (t1, t2) of the signal that is the sum of the free induction decay signals FID (t11, t2) - FID (t1n, t2) regarding the n different expansion periods. (e) Finally, we take the double Fourier transform of the function S (t1, t2) into frequency domain with respect to t1 and t2. In the n different expansion periods t11 - t1n in the step (d), m sets of expansion sub-periods t111 - t11m, t121 - t12m, . . . , t1n1 - t1nm which are successively made different from one another by a minute time $\Delta\tau$ are further set. The steps (a)–(c) are carried out in the n×m expansion sub-periods. The resulting free induction decay signals which are m in number per each of the n different expansion periods t11 - t1n are summed up to reconstruct the free induction decay signals FID (t11, t2) - FID (t1n, t2).

Figure 8:
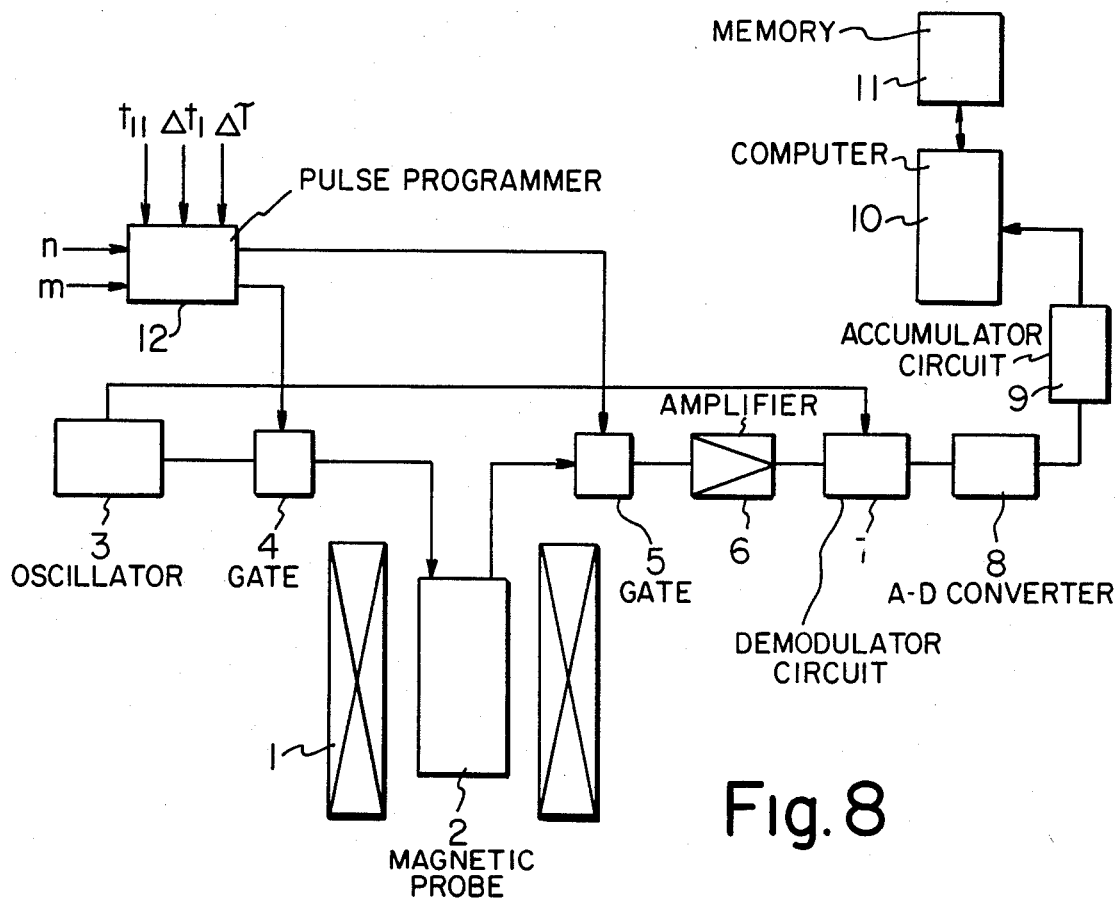
FIG. 8 is a block diagram of an apparatus emodying the method according to the invention.

Referring next to FIG. 8, there is shown an apparatus for carrying out the nuclear magnetic resonance spectrometry utilizing the present invention. This apparatus includes a magnet 1 for generating a static magnetic field, a nuclear magnetic probe 2 placed in the static field, and an RF oscillator 3. The oscillator 3 produces an RF signal including the nuclear magnetic resonance frequency of the nuclei under observation. This RF signal is fed as an RF pulse to the probe via a gate 4. Then, a transmitter coil mounted in the probe emits the pulse toward the sample. A resonance signal is then obtained from the probe in response to the application of the RF pulse. The signal is fed via a gate 5 and an amplifier 6 to a demodulator circuit 7, where it is demodulated using an RF signal supplied from the oscillator 3. The demodulated free induction decay signal is then converted into digital form by an analog-to-digital converter 8. The resultant signal is fed via an accumulator circuit 9 to a computer 10, and then it is stored in a memory 11 included in the computer. The gates 4 and 5 are enabled or disenabled by a pulse programmer 12.

In the arrangement described above, a human operator previously sets the initial value t11 of the expansion period t1, the number of the expansion periods n, the difference $\Delta$ t1 between the successive expansion periods, the increment $\Delta\tau$ by which the expansion sub-periods are successively changed in each of the n different periods, the number of the sub-periods m, and the operator enters these parameters into the pulse programmer 12. The number of the sub-periods m is also entered in the accumulator circuit as the information about the number of the values to be accumulated.

Figure 9:
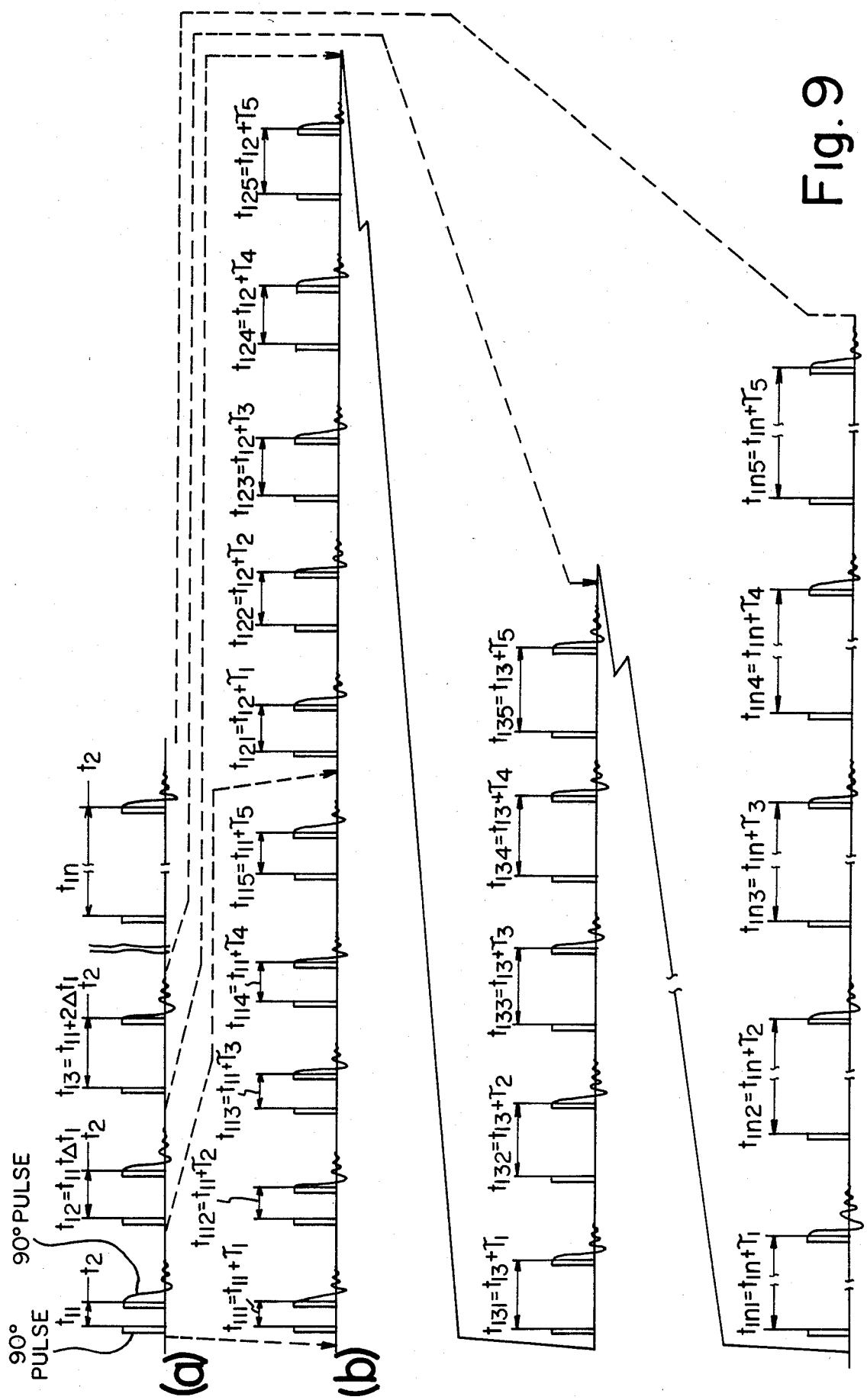
FIG. 9 is a timing diagram of a sequence of measurements which is carried out under the control of a pulse programmer.

FIG. 9 is a timing diagram of a sequence of measurements which is performed under the control of the pulse programmer. FIG. 9(a) shows a conventional sequence of measurements. As an example, a sequence of pulses in which a 90° pulse is followed by t1, a second 90° pulse, and t2 in turn is employed according to shift correlation. The expansion period t1 is successively changed by t1 into t11, t12, t13, . . . , t1n. A measurement is made in each of these n different periods to produce n free induction decay signals FID (t11, t2), FID (t12, t2), FID (t13, t2), . . . , FID (t1n, t2). As mentioned previously, a two-dimensional NMR spectrum is obtained by taking the double Fourier transform of the function S (t1, t2) of the signal which is the sum of these n free induction decay signals, with respect to t1 and t2.

Referring to FIG. 9(b), there is shown a sequence of measurements according to the invention. As indicted by the broken lines, a single measurement in the prior art method described above corresponds to five measurements according to the invention. In this novel process, the five free induction decay signals FID (t111, t2), FID (t112, t2), . . . , FID (t115, t2) which are obtained in the first five measurements are accumulated in the accumulator circuit 9. The resulting signal is fed as FID (t11, t2) to the computer 10. In the above notation, the following relations hold:

t111=t11 +$\tau$1, t112=t11+$\tau$2, . . . , t115=t11+$\tau$5, where $\tau$1=0, $\tau$2=$\Delta\tau$, $\tau$3=3$\Delta\tau$, $\tau$4=2$\Delta\tau$, $\tau$5=4$\Delta\tau$.

The five free induction decay signals FID (t121, t2), FID (t122, t2), . . . , FID (t125, t2) obtained by the next five measurements are summed up in the accumulator circuit 9 in exactly the same manner. The resultant signal is given as FID (t12, t2) to the computer 10. In the above notation, the following relatioships hold:

t121=t12+$\tau$1=t11+$\Delta$t1+$\tau$1, t112=t12+$\tau$2, . . . , t115+t12 +$\tau$5, where $\tau$1=0, $\tau$2=$\Delta\tau$, $\tau$3=2$\Delta\tau$, $\tau$4=3$\Delta\tau$, $\tau$5=4$\Delta\tau$ in the same fashion as the foregoing.

In this way, five measurements are made for each succeeding step of the process. In the final five measurements, free induction decay signals FID (t1n1, t2), FID (t1n2, t2), ..., FID (t1n5, t2) are obtained. These signals are added up to form FID (t1n, t2), which is then fed to the computer 10, thus completing the sequence of the measurements. The computer 10 calculates a two-dimensional NMR spectrum from the function S (t1, t2) of the signal that is a set of the n free induction decay signals FID (t11, t2), FID (t12, t2), FID (t13, t2), ..., FID (t1n, t2) which are stored in the memory 11.

We now take into account only t1 and assume that the free induction decay signal before accumulation is given by S (t1). If the number of values to be accumulated is expanded to M, the sum $\bar{S}$ (t1) obtained by accumulation corresponds to equation (1) and is given by $$\bar{S}(t1) = \sum_{i=1}^{M} S(t1 + \tau i) \quad (7)$$

where $\tau i$ is the value of $\tau$ of the i-th free induction decay signal. If the difference between the successive values that $\tau i$ takes on is constant, then equation (7) can be modified as follows:

$$\bar{S}(t1) = \int_{\infty}^{\infty} S(t1+\tau) \times \{U(t1) ш(t1)\} d\tau \quad (8)$$

where ш (t) is a sample function and U(t) is a boxcar function. (t1)

Figure 10:
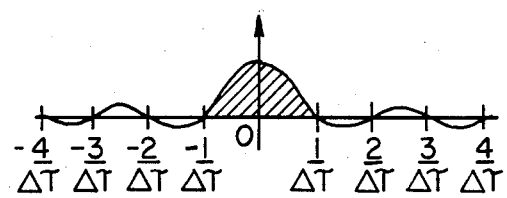
FIG. 10 is a waveform diagram of a sinc function.

By converting both sides of equation (8) into frequency $\omega 1$ using the thereon of the Fourier transformation, the following equation that corresponds to equation (2) is obtained:

$$\bar{S}(\omega 1) = S(\omega 1) \{\text{sinc}(\omega 1 \cdot \Delta \tau) * (\omega 1 \cdot \Delta \tau / M)\} \quad (9)$$

where sinc $(\omega 1 \cdot \Delta \tau)$ is defined as sinc $(\pi \Delta 1 \cdot \Delta \tau)/(\pi \omega 1 \cdot \Delta \tau)$ and shown in FIG. 10.

The term included in the brackets ({ }) of the right side of equation (9) corresponds to a filter function as described already, and the function shown in FIG. 10 does exist. Hence, only those signals which have frequency components of the pass band indicated by the hatching in FIG. 10 are accumulated and remain held in the accumulator. It is therefore possible to remove unnecessary regions of frequencies. In particular, a filter is formed by repeating the sinc function of FIG. 10 at every given frequency interval $M/\Delta \tau$. The width and the frequency of the pass band can be appropriately determined by changing $\Delta \tau$ and M. Thus, unwanted regions of frequencies can be removed at the instant of accumulation, i.e., before the final data is stored in the memory. Consequently, the amount of data can be reduced greatly, permitting a decrease in the storage capacity.

Although the number of measurements for accumulation in the above example is larger than the conventional method, the substantial periods of time necessary for both methods do not make a great difference, because, in the conventional method, the sequence of measurements as shown in FIG. 9(a) is repeated many times and the resulting data is accumulated to enhance the signal-to-noise ratio.

Figures 11A, 11B:
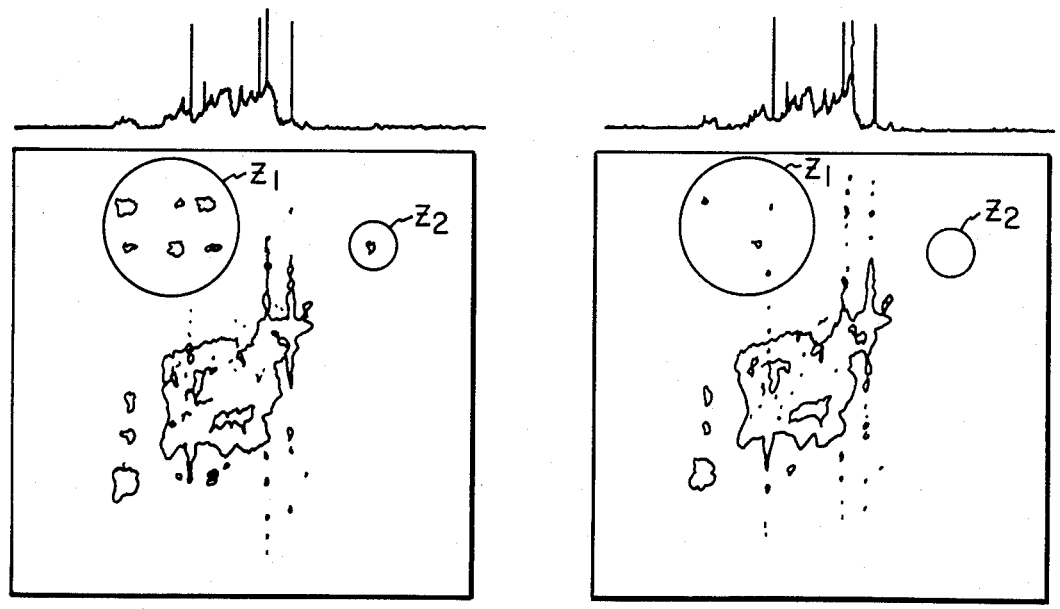
FIGS. 11(a), 11(b), 12(a), and 12(b) are diagrams showing the results of experiments for illustrating the effect obtained by the invention.

FIGS. 11(a), 11(b), 12(a), and 12(b) show the results of experiments which reveal the effect obtained by the nuclear magnetic resonance spectrometry described above. FIGS. 11(a) and 11(b) show two-dimentional, correlation spectra which have been obtained from the hydrogen nuclei of cholesterol acetate in the same way as in FIG. 7. In the spectrum of FIG. 11(a) which has been obtained with usual two-dimensional magnetic resonance spectrometry, the peaks on the lower magnetic field side that correspond to the peaks P1 and P2 in FIG. 7 are introduced in the data, and those which have been formed by folding bak of the peaks appear in regions Z1 and Z2. In contrast, in the spectrum of FIG. 11(b) which has been obtained using the novel two-dimensional nuclear magnetic resonance spectrometery, the unwanted peaks have been removed considerably. In region Z2, the peak has disappeared. Also, in region Z1, the intensity of the peak has been attenuated to a great extent. The measurement of the spectrum of FIG. 11(b) was made under the condition of M=15 and $\Delta \tau = \Delta t 1/14$.

Figure 12A:
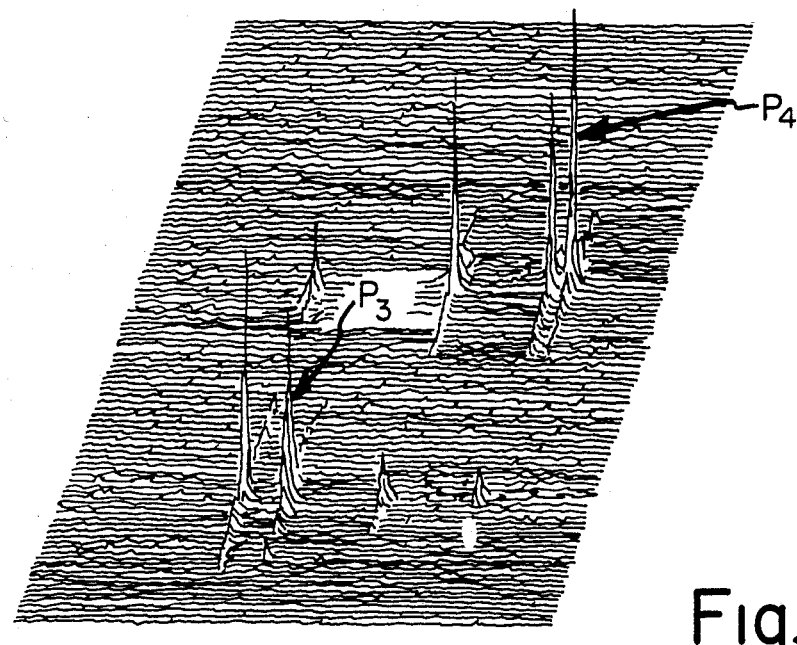
Figure 12B:
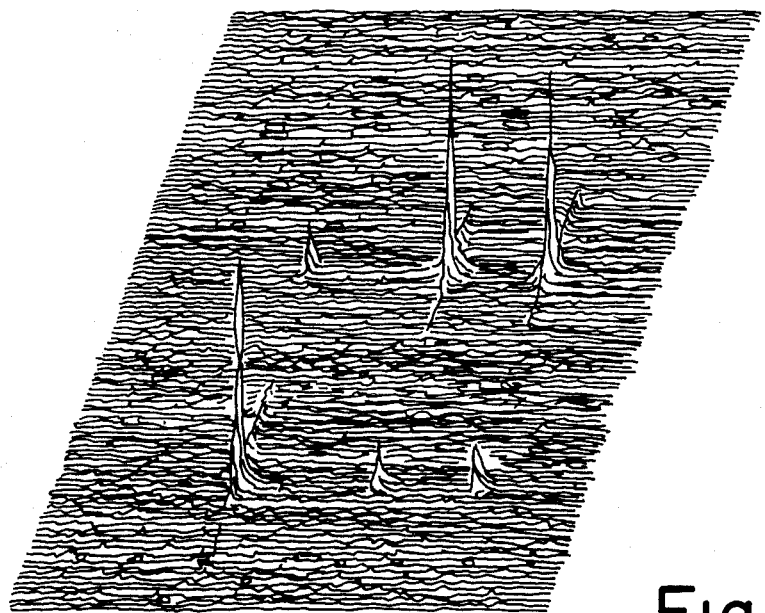

FIGS. 12(a) and 12(b) show two-dimensional $^{13}C$-$^1H$ shift correlation spectra of 2,4,5-trichlorophenol, in which there exists J couplings among two hydrogen nuclei and six carbon nuclei. The magnitude of the coupling of the carbon nuclei coupled to the nearby protons differs by a factor of ten or more from that of the carbon nuclei which are not bonded to any proton but coupled to distant protons. In the spectrum of FIG. 12(a) obtained usual nuclear magnetic resonance spectrometry, shift correlation peaks P3 and P4 caused by short-distance coupling are observed. In the spectrum of FIG. 12(b) obtained utilizing the novel spectrometry, the two peaks cannot be seen.

As thus far described in detail, the nuclear magnetic resonance spectrometry according to the invention eliminates unwanted peaks and can curtail the storage capacity of the memory used.

It is to be understood that the nuclear magnetic resonance spectrometry is not limited to the specific example set forth above, but rather various changes and modifications may be made. For example, the function served by the accumulation circuit of the apparatus of FIG. 8 may be performed by the computer. Also, it should be understood that the novel nuclear magnetic resonance spectrometry can be applied to every kind of two-dimensional NMR spectrometry including $^{13}C$ shift resolved two-dimensional NMR spectrometry, J resolved two-dimensional NMR spectrometry, homonuclear shift correlation two-dimensional NMR spectrometry, heteronuclear shift correlation two-dimensional NMR spectrometry, two-dimensional NOE (nuclear Overhauser effects) NMR spectrometry, and chemical exchange two-dimensional NMR spectrometry. In addition, in the sequence of measurements of FIG. 9(b), the measurements were made in the sequence t111=t11+$\tau$1, t112=t11+$\tau$2, ..., t115=t11+$\tau$5, but it is also possible to take the sequence of $\tau$1 -$\tau$5 in any arbitrary manner.

I claim:

1. A method of obtaining a pseudofiltering effect in the process of collecting data comprising the steps for:
    (a) repeatedly generating a time origin signal;
    (b) after a delay period sampling a signal at regular intervals following the time origin signal;
    (c) converting the sampled values to digital form;
    (d) accumulating the resulting digital data;
    (e) repeating steps (a) to (d) changing the duration of the delay period; and
    (f) performing arithmetic operations upon the data to remove unwanted frequency components.

2. The method set forth in claim 1, wherein the signal is a nuclear magnetic resonance signal and wherein the time origin arises when an exciting RF pulse or pules train is applied to a sample.

3. A method of obtaining a pseudofiltering effect in the process of collecting data comprising the steps for:
    (a) repeatedly generating a time origin signal;
    (b) after a delay period sampling a signal at regular intervals following the time origin signal;
    (c) converting the sampled values to digital form;
    (d) amplifying the sampled values with gains according to the duration of the delay period;
    (e) accumulating the resulting digital data;
    (f) repeating steps (a) to (e) changing the duration of the delay period and the gain; and
    (g) performing arithmetic operations upon the data to remove unwanted frequency components.

4. The method as set forth in claim 3, wherein the signal is a nuclear magnetic resonance signal and wherein the time origin arises when an exciting RF pulse or pulse train is applied to a sample.

5. In nuclear magnetic resonance spectrometry for obtaining a two-dimensional nuclear magnetic resonance spectrum from a sample including a system of nuclear magnetic resonators, the steps of:

(a) applying an RF pulse to the sample to disequilibrate the system of the resonators beforehand;
(b) causing the disequilibrated condition to proceed during an expansion period of t1;
(c) then detecting and recording the free induction decay signal derived from the resonators during a period of t2;
(d) repeating the aforementioned steps (a)–(c) for n different expansion periods t11 - t1n to obtain the function S (t1, t2) of the signal that is the sum of the free induction decay signals FID (t11, t2) - FID (t1n, t2) which were obtained for the n different expansion periods, wherein m expansion sub-periods t111 - t11m, t121 - t12m, ..., t1n1 - t1nm which successively differ by a minute time $\Delta\tau$ are set in each of the n expansion periods t11 - t1n in this step (d), carrying out the steps (a)–(c) during these n x m sub-periods, and the m free induction decay signals which are produced during each of the periods are accumulated to reconstruct the aforementioned signals FID (t11, t2) - FID (T1n, t2); and
(e) taking the double Fourier transform of the function S (t1, t2) into frequency domain with respect to t1 and t2.

* * * * *